(12) United States Patent
Kan et al.

(10) Patent No.: US 10,559,940 B1
(45) Date of Patent: Feb. 11, 2020

(54) LASER POWER CONTROL SYSTEM FOR LASER DIODE USING DUAL CLOSE LOOPS

(71) Applicant: Rafael Microelectronics, Inc., Hsinchu County (TW)

(72) Inventors: Meng-Ping Kan, Hsinchu County (TW); Kuan-Hsun Wang, New Taipei (TW)

(73) Assignee: Rafael Microelectronics, Inc., Hsinchu County (TW)

( * ) Notice: Subject to any disclaimer, the term of this patent is extended or adjusted under 35 U.S.C. 154(b) by 0 days.

(21) Appl. No.: 16/372,368

(22) Filed: Apr. 1, 2019

(51) Int. Cl.
  *H01S 5/042* (2006.01)
  *H01S 5/0683* (2006.01)
  *H01S 5/068* (2006.01)
  *H01S 5/06* (2006.01)

(52) U.S. Cl.
  CPC ............... *H01S 5/042* (2013.01); *H01S 5/06* (2013.01); *H01S 5/0683* (2013.01); *H01S 5/06808* (2013.01)

(58) Field of Classification Search
  CPC ........ H01S 5/06; H01S 5/06808; H01S 5/042; H01S 5/0683
  See application file for complete search history.

(56) References Cited

U.S. PATENT DOCUMENTS

| 4,292,606 A * | 9/1981 | Trimmel ............. H01S 5/06832 359/237 |
| 2010/0158055 A1* | 6/2010 | Giebel ............... G06K 7/10584 372/29.011 |

* cited by examiner

*Primary Examiner* — Armando Rodriguez
(74) *Attorney, Agent, or Firm* — Winston Hsu

(57) ABSTRACT

The present invention discloses a laser power control system includes a laser diode, a monitor photodiode, a bias control circuit, a modulation control circuit, a digital controller, and a laser diode driver. The laser power control system forms an automatic extinction ratio control loop that is configured to control the extinction ratio of the laser diode by comparing a monitor current with a first target current to keep the extinction ratio of the laser diode at the predetermined first target current. The laser power control system forms an automatic power control loop that is configured to control the average power of the laser diode by comparing the monitor current with the second target current to keep the average power of the laser diode at the predetermined second target current.

8 Claims, 2 Drawing Sheets

LASER POWER CONTROL SYSTEM FOR LASER DIODE USING DUAL CLOSE LOOPS

BACKGROUND OF THE INVENTION

1. Field of the Invention

The present invention relates to a laser power control system, and more particularly, to a laser power control system for laser diode using dual close loops.

2. Description of the Prior Art

Laser diodes are advantageously employed in digital optical data communications applications as they have relatively broad bandwidth resulting in high data rates. Unfortunately, the transmission power levels of a laser diode may vary in an undesirable manner overtime due to changing temperature, age of the laser diode, and other factors.

Therefore, controlling the laser diode to have stable transmission power levels is always a target in the industry.

SUMMARY OF THE INVENTION

It is therefore an objective of the present invention to provide an automatic dual close loop control circuit for controlling the laser diode to have stable transmission power levels.

The present invention discloses a laser power control system including a laser diode configured to convert an output current into a light signal; a monitor photodiode configured to convert the light signal into a monitor current; a bias control circuit coupled to the monitor photodiode; and a digital controller coupled to the bias control circuit and the laser diode, and configured to adjust a bias current of the laser diode current according to the first comparison result. The bias control circuit includes a first current comparator comprising a negative input terminal coupled to the monitor photodiode and a positive input terminal coupled to a first target current, and configured to compare the monitor current with the first target current to generate a first comparison result; a clamp diode comprising an anode coupled to an output terminal of the first current comparator and a cathode, and configured to clamp the first comparison result; and a capacitor comprising one end coupled to the cathode of the clamp diode and another end coupled to a ground voltage, and configured to store the first comparison result.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
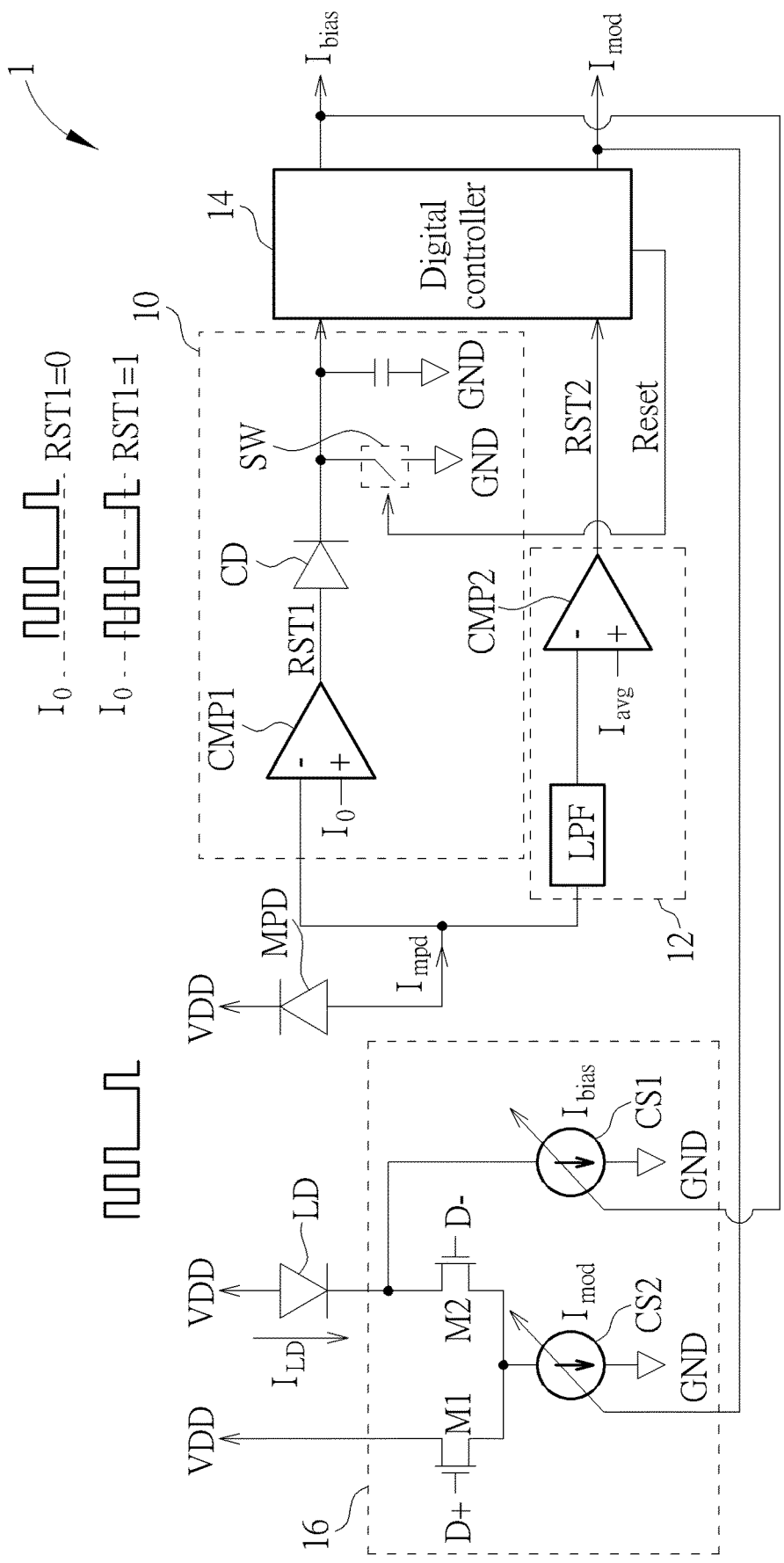
FIG. 1 is a schematic diagram of a laser power control system according to an embodiment of the present invention.

FIG. 1 is a schematic diagram of a laser power control system 1 according to an embodiment of the present invention. The laser power control system 1 includes a laser diode LD, a monitor photodiode MPD, a bias control circuit 10, a modulation control circuit 12, a digital controller 14, and a laser diode driver 16.

The laser diode LD includes an anode coupled to a system voltage VDD and a cathode coupled to the laser diode driver 16, and is configured to convert an output current into a light signal. The output current includes a direct current component of bias current $I_{bias}$ and an alternating current component of modulation current $I_{mod}$. The bias current $I_{bias}$ may be greater than a threshold current of the laser diode LD, while the modulation current $I_{mod}$ is data information transmitted by a user.

The monitor photodiode MPD is coupled to the bias control circuit 10 and the modulation control circuit 12, and configured to receive the light signal from the laser diode LD to convert the light signal into a monitor current $I_{mpd}$. The monitor current $I_{mpd}$ is transmitted to the bias control circuit 10 and the modulation control circuit 12 for adjustments to the bias current $I_{bias}$ and the modulation current $I_{mod}$, respectively. The monitor current $I_{mpd}$ is separately transmitted to the bias control circuit 10 and the modulation control circuit 12 by time division control.

The bias control circuit 10 includes a first current comparator CMP1, a clamp diode CD, a switch circuit SW, and a capacitor. The first current comparator CMP1 includes a negative input terminal for receiving the monitor current $I_{mpd}$, a positive input terminal for receiving a first target current $I_0$, and an output terminal for outputting a first comparison result RST1. The first target current $I_0$ is a predetermined value that equals a target minimum magnitude of the output power. For example, when the first target current $I_0$ is smaller than the monitor current $I_{mpd}$, the first current comparator CMP1 outputs the first comparison result RST1 indicating a logic 0; when the first target current $I_0$ is greater than the monitor current $I_{mpd}$, the first current comparator CMP1 outputs the first comparison result RST1 indicating a logic 1.

The first target current $I_0$ is a predetermined value that is given by a test procedure to adaptive to different kinds of laser diode. For example, given the target values of extinction ratio and average power, the bias current $I_{bias}$ and the modulation current $I_{mod}$ are adjusted in search of the first target current $I_0$. Meanwhile, the light power outputted by the laser diode LD is converted into the monitor current $I_{mpd}$ by the monitor photodiode MPD, and outputted to the first comparator CMP1. By adjusting the setting of the first target current $I_0$ and observing a toggle point of the first comparator CMP1, the first target current $I_0$ may be determined.

The clamp diode CD includes an anode coupled to the output terminal of the first current comparator CMP1 and a cathode coupled to the switch circuit SW, and is configured to clamp the first comparison result RST1 to a high power level when the first target current $I_0$ is greater than the monitor current $I_{mpd}$. When the first comparison result RST1 is at a low power level, the clamp diode CD is turned off to keep the low power level when the first target current $I_0$ is smaller than the monitor current $I_{mpd}$.

The capacitor is coupled between the cathode of the clamp diode CD and a ground voltage, and configured to store the first comparison result RST1 as information for adjustment to the bias current $I_{bias}$.

The switch circuit SW is coupled between the cathode of the clamp diode CD and the ground voltage GND. After the bias current $I_{bias}$ has been adjusted, the digital controller 14 is configured to a generate a reset signal to the switch circuit SW to connect the capacitor to the ground voltage GND to discharge the capacitor and reset the first comparison result RST1; and when the bias current $I_{bias}$ is not adjusted, the switch circuit SW disconnects the capacitor from the ground voltage GND to store the first comparison result RST1.

The modulation control circuit 12 includes a low pass filter LPF and a second current comparator CMP2. The low pass filter LPF is coupled to the monitor photodiode MPD, and configured to extract a direct current from the monitor current $I_{mpd}$. The second current comparator CMP2 includes a negative input terminal coupled to the low pass filter LPF, a positive input terminal coupled to a second target current $I_{avg}$, and an output terminal for outputting a second comparison result RST2. The second current comparator CMP2 is configured to compare the direct current with the second target current $I_{avg}$ to generate the second comparison result RST2 to the digital controller 14. The digital controller 14 is configured to adjust a modulation current $I_{mod}$ of the output current according to the second comparison result RST2.

The second target current $I_{avg}$ is a predetermined value that equals an average among a target maximum magnitude and a target minimum magnitude of the output current (e.g., $(I_0+I_1)/2$), the target maximum magnitude $I_1$ of the output current corresponds to a logic 1 of the light signal, and the target minimum magnitude $I_0$ of the output current corresponds to a logic 0 of the light signal.

The second target current $I_{avg}$ is a predetermined value that is given by a test procedure to adaptive to different kinds of laser diode. For example, the target light power outputted by the laser diode LD is converted into the monitor current $I_{mpd}$ by the monitor photodiode MPD, and outputted to the second comparator CMP2. By adjusting the setting of the second target current $I_{avg}$ and observing a toggle point of the second comparator CMP2, the second target current $I_{avg}$ may be determined.

The laser diode driver 16 includes a first transistor M1, a second transistor M2, a bias current source CS1, and a modulation current source CS2. The first transistor M1 includes a drain coupled to the system voltage VDD, a gate coupled to a first data signal D+, and a source coupled to the modulation current source CS2. The second transistor M2 includes a drain coupled to the cathode of the laser diode LD, a gate coupled to a second data signal D-, and a source coupled to the modulation current source CS2. The bias current source CS1 is coupled to the cathode of the laser diode LD and the digital controller 14, and configured to generate the bias current $I_{bias}$ of the output current. The modulation current source CS2 is coupled to the sources of the first transistor M1 and the second transistor M2, and configured to generate the modulation current $I_{mod}$ of the output current.

In operation of the laser power control system 1, the monitor photodiode MPD receives the light signal emitted by the laser diode LD to generate the monitor current $I_{mpd}$ to the bias control circuit 10 and the modulation control circuit 12, wherein an operating response of the monitor photodiode MPD is not varied by temperature. The monitor current $I_{mpd}$ outputted by the monitor photodiode MPD is a high speed data signal, and the modulation control circuit 12 extracts the direct component of the monitor current $I_{mpd}$ by the low pass filter LPF to compare with the predetermined second target current $I_{avg}$ to generate the second comparison result RST2 to the digital controller 14. The bias control circuit 10 compares the alternating component of the monitor current $I_{mpd}$ with the predetermined first target current $I_0$ to generate the first comparison result RST1 to be clamped by the clamp diode CD and stored by the capacitor. Finally, the digital controller 14 adjusts the bias current $I_{bias}$ according to the first comparison result RST1 and adjusts the modulation current $I_{mod}$ according to the second comparison result RST2. By the operation of the laser power control system 1, the output power of the laser diode LD can be a constant without the influence of varying temperature, age of the laser diode, and other factors.

Note that the monitor current $I_{mpd}$ is an alternating current, however, the first current comparator CMP1 only compares the lowest voltage level of the monitor current $I_{mpd}$ with the predetermined first target current $I_0$. For example, in FIG. 1, the first current comparator CMP1 outputs the first comparison result RST1 with a logic 0 when the lowest voltage level of the monitor current $I_{mpd}$ is greater than the first target current $I_0$; the first current comparator CMP1 outputs the first comparison result RST1 with a logic 1 when the lowest voltage level of the monitor current $I_{mpd}$ is smaller than the first target current $I_0$.

In other words, the modulation control circuit 12, the digital controller 14, and the modulation current source CS2 form an automatic power control close loop that is configured to control the average power of the laser diode LD by comparing the monitor current $I_{mpd}$ with the second target current $I_{avg}$ to keep the average power of the laser diode at the predetermined second target current $I_{avg}$.

Also, the bias control circuit 10, the digital controller 14, and the bias current source CS1 form an automatic extinction ratio control close loop that is configured to control the extinction ratio of the laser diode LD by comparing the monitor current $I_{mpd}$ with the first target current $I_0$ to keep the extinction ratio of the laser diode at the predetermined first target current $I_0$.

The automatic power control close loop and the automatic extinction ratio control close loop alternatively adjust the average power and the extinction ratio of the laser diode, because changing the setting of the bias current $I_{bias}$ may also change the average power as well as the extinction ratio. On the other hand, changing the setting of the modulation current $I_{mod}$ may also change the average power as well as the extinction ratio. Therefore, by alternatively changing the setting of the bias current $I_{bias}$ and the modulation current $I_{mod}$ may reach a steady state of the output power of the laser diode.

Figure 2:
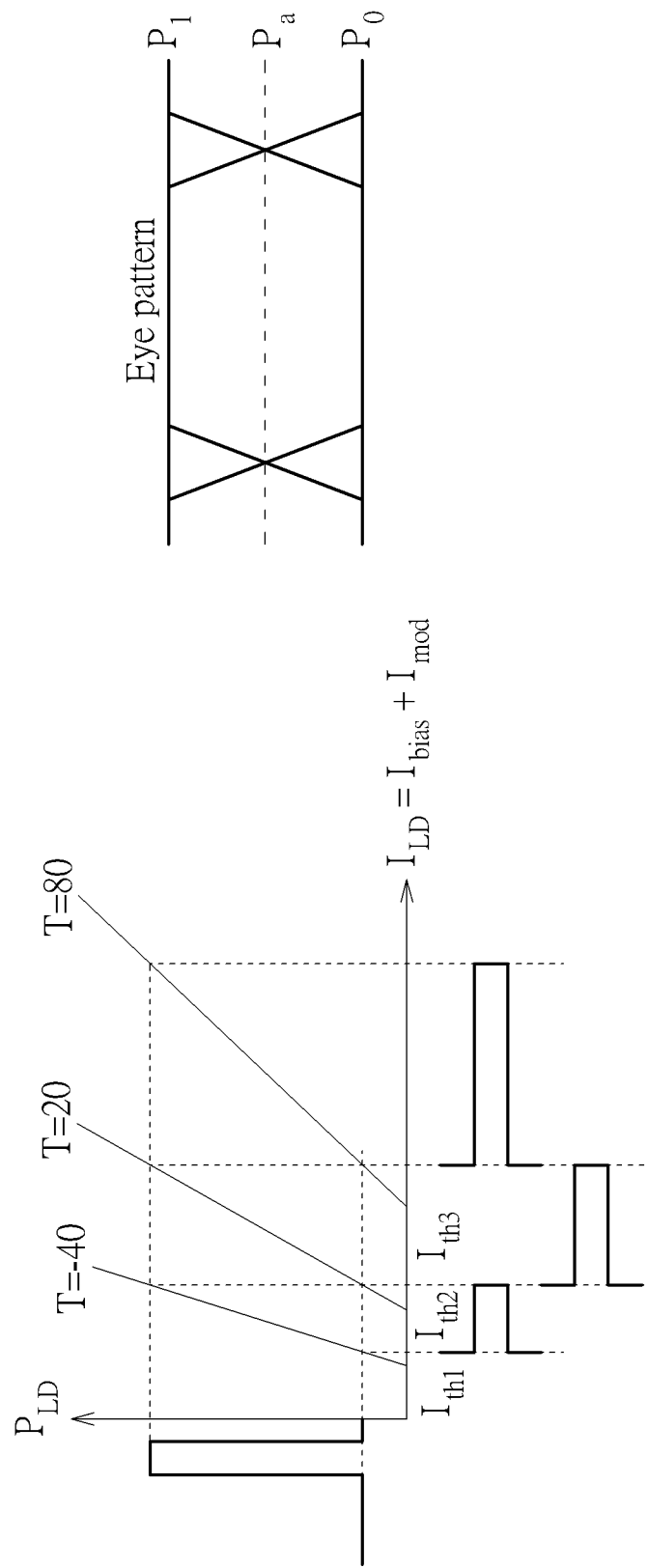
FIG. 2 illustrates an output power to output current diagram and an eye pattern of the laser diode according to an embodiment of the present invention.

FIG. 2 illustrates an output power to output current ($P_{LD}$-$I_{LD}$) diagram and an eye pattern of the laser diode LD according to an embodiment of the present invention. At a temperature of −40 Celsius degrees, the laser diode LD has a conversion curve with a higher slop and efficiency, the laser power control system 1 provides the output current $I_{LD}$ greater than a first threshold current $I_{th1}$ to the laser diode LD. At a temperature of 20 Celsius degrees, the laser diode LID has a conversion curve with a medium slop and efficiency, the laser power control system 1 provides the output current $I_{LD}$ greater than a second threshold current $I_{th2}$ to the laser diode LD. At a temperature of 80 Celsius degrees, the laser diode LD has a conversion curve with a lower slop and efficiency, the laser power control system 1 provides the output current $I_{LD}$ greater than a third threshold current $I_{th3}$ to the laser diode LD. Note that there are only 3 sets of conversion curves in this embodiment, which is not limited, each temperature corresponds to a conversion curve.

The extinction ratio of the laser diode LD can be represented by a function of ER=10*log ($P_1/P_0$)=10*log ($I_1/I_0$), wherein P=I*V and given a cross voltage of the laser diode is a constant under different driving current. In practice, given the monitor photodiode MPD with 100% of responsivity, 1 Watt power of the laser diode LD can be converted into 1 Ampere current; or, the monitor photodiode MPD with 90% of responsivity, 1 Watt power of the laser diode LD can be converted into 0.9 Ampere current The average power of the laser diode LD can be represented by a function of $P_{avg}=10*\log(P_a)=10*\log((I_1+I_0)/2)=10*\log(I_{avg})$ according to the eye pattern of the laser diode LD.

To sum up, the extinction ratio of the laser diode may be kept at the predetermined first target current $I_0$ by the automatic extinction ratio control close loop that is configured to control the extinction ratio of the laser diode by comparing the monitor current $I_{mpd}$ with the first target current $I_0$. The average power of the laser diode may be kept at the predetermined second target current $I_{avg}$ by the automatic power control close loop that is configured to control the average power of the laser diode by comparing the monitor current $I_{mpd}$ with the second target current $I_{avg}$. By the operation of the laser power control system of the present invention, the output power of the laser diode can be a constant without the influence of varying temperature, age of the laser diode, and other factors.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A laser power control system, comprising:
    a laser diode configured to convert an output current into a light signal;
    a monitor photodiode configured to convert the light signal into a monitor current;
    a bias control circuit coupled to the monitor photodiode, comprising:
        a first current comparator comprising a negative input terminal coupled to the monitor photodiode and a positive input terminal coupled to a first target current, and configured to compare the monitor current with the first target current to generate a first comparison result;
        a clamp diode comprising an anode coupled to an output terminal of the first current comparator and a cathode, and configured to clamp the first comparison result; and
        a capacitor comprising one end coupled to the cathode of the clamp diode and another end coupled to a ground voltage, and configured to store the first comparison result; and
    a digital controller coupled to the bias control circuit and the laser diode, and configured to adjust a bias current of the output current according to the first comparison result.

2. The laser power control system of claim 1, wherein the bias control circuit comprises a switch circuit coupled to the capacitor, the ground voltage and the digital controller.

3. The laser power control system of claim 2, wherein after the bias current has been adjusted, the digital controller is configured to generate a reset signal to the switch circuit to connect the capacitor to the ground voltage to discharge the capacitor and reset the first comparison result; and when the bias current is not adjusted, the digital controller is configured to generate the reset signal to the switch circuit to disconnect the capacitor from the ground voltage to reserve the first comparison result, and the switch is opened.

4. The laser power control system of claim 1, wherein the first target current equals a target minimum magnitude of the output power of the laser diode and a low level current of the monitor current of the monitor photodiode.

5. The laser power control system of claim 1, further comprising a modulation control circuit coupled to the monitor photodiode and the digital controller, wherein the modulation control circuit comprises:
    a low pass filter coupled to the monitor photodiode, and configured to extract a direct current from the monitor current; and
    a second current comparator comprising a negative input terminal coupled to the low pass filter and a positive input terminal coupled to a second target current, and configured to compare the direct current with the second target current to generate a second comparison result to the digital controller;
    wherein the digital controller is configured to adjust a modulation current of the output current according to the second comparison result.

6. The laser power control system of claim 5, wherein the second target current equals an average among a target maximum magnitude and a target minimum magnitude of the output current, the target maximum magnitude of the output current corresponds to a logic 1 of the light signal, and the target minimum magnitude of the output current corresponds to a logic 0 of the light signal.

7. The laser power control system of claim 5, further comprising a laser diode driver, wherein the laser diode driver comprises:
    the laser diode comprising an anode coupled to a system voltage and a cathode;
    a first transistor comprising a drain coupled to the system voltage, a gate coupled to a first data signal, and a source;
    a second transistor comprising a drain coupled to the cathode of the laser diode, a gate coupled to a second data signal, and a source;
    a bias current source coupled to the cathode of the laser diode and the digital controller, and configured to generate the bias current of the output current; and
    a modulation current source coupled to the sources of the first and second transistors, and configured to generate the modulation current of the output current.

8. The laser power control system of claim 5, wherein the second target current equals a target average output power outputted by the laser diode and an average current of the monitor current.

* * * * *